May 20, 1969 J. R. BIARD 3,445,793

HIGH FREQUENCY STRIP TRANSMISSION LINE

Filed Sept. 18, 1964

3,445,793
HIGH FREQUENCY STRIP TRANSMISSION LINE

James R. Biard, Richardson, Tex., assignor to Texas Instruments Incorporated, Dallas, Tex., a corporation of Delaware Filed Sept. 18, 1964, Ser. No. 397,492
Int. Cl. H01p 3/08
U.S. Cl. 333—84 9 Claims

ABSTRACT OF THE DISCLOSURE

In the disclosed high frequency device contact is provided between a high resistivity semiconductor substrate and a conductive ground plane on one surface and a stripline conductor on the opposite surface. A smooth boundary is provided between the surfaces of the substrate and the ground plane and stripline conductor respectively by disposing a predetermined metallic film intermediate the substrate surfaces and the ground plane and stripline conductor respectively.

This invention relates to high frequency integrated circuits, and more specifically relates to a strip transmission line for use in such circuits.

In general, integrated circuits comprise a semiconductor substrate with active and passive circuit components formed in and on the surface of the substrate by diffusion, epitaxial growth and evaporation techniques. Perhaps the most common and useful integrated circuits utilize a silicon substrate or wafer. The components of the circuit such as transistors, diodes, resistors and the like are often formed by diffusion through openings in a silicon dioxide mask formed on the surface of the wafer. Electrical contact is then made with the terminals of the components by means of metal strips which are deposited on the insulating layer of silicon dioxide and extend through openings into contact with the terminals. Inductors and the like may also be formed from the metallic conductors deposited on the oxide film. The conventional structure is adequate for low frequency applications. However, as the frequency at which the circuit is to operate increases, the strip-line conductors deposited on the oxide layer result in loss due to the low dielectric constant of the oxide material and lowers the Q of the system. High-resistivity silicon has a relatively high dielectric constant.

It is an object of this invention to provide a strip transmission line structure which will produce a minimum loss at high frequencies and which is compatible with integrated circuits formed on high-resistivity silicon and gallium arsenide substrates. This is accomplished by depositing a ground plane on one surface of a high resistivity, high dielectric constant wafer and depositing a strip transmission line on the other side of the wafer. More specifically, the wafer is high-resistivity semiconductor material, preferably intrinsic silicon or gallium arsenide. Although the strip line is not electrically insulated from the ground plane, at high frequencies the shunt resistance of the wafer is insignificant. In order to reduce the series resistance of the strip line to a minimum, the metal forming the strip line is preferably gold. However, gold deposited directly on silicon produces a grainy or aggregate boundary region of silicon and gold as a result of the low eutectic temperature of gold and silicon, and these discontinuities in the edges of the strip line would produce losses. In accordance with the present invention, however, these adverse boundary regions are prevented from forming by first depositing a metal having a eutectic temperature with silicon, or the other material of the wafer, substantially above the higher temperature to be used during or subsequent to the deposition of the metal layer. More specifically, a very thin film, only a few angstroms thick, of molybdenum, vanadium, platinum, nickel or tungsten may be deposited on the surface of the wafer under the gold strips.

For a more complete understanding of the present invention and for further objects and advantages thereof, reference may now be had to the following description taken in conjunction with the accompanying drawings in which.

Figure 1:
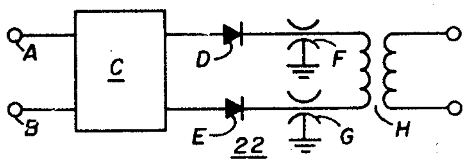
FIGURE 1 is a lumped constant circuit diagram of a balanced mixer requiring a pair of diodes.

Referring now to FIGURE 1, a mixer circuit involves a signal input terminal A and a local oscillator input terminal B leading to coupler C. Output lines from coupler C extend to diodes D and E, respectively, with shunt capacitances F and G leading to ground. An output transformer H provides a path for an output signal from the mixer which may be one of the modulation products from the mixer.

The present invention involves the construction of a diode particularly suitable for use as the diodes D and E in an integrated semiconductor circuit embodiment such as represented by the mixer of FIGURE 1.

A mixer converts the received signal to a lower frequency preferably with a minimum of added noise. To optimize the noise level for the receiver, both the signal-to-noise ratio of the mixer and the conversion loss in the mixer must be as low as possible. A detected microwave signal and a local oscillator output signal are applied to a semiconductor junction and the difference, as an IF output signal, is extracted. Mixers employing diodes constructed in accordance with the present invention and illustrated in FIGURES 2–5 may be employed for operation at frequencies in the X-band. Operation thereof is characterized by low loss, employing high ratio couplers of integrated circuit form.

Figure 2:
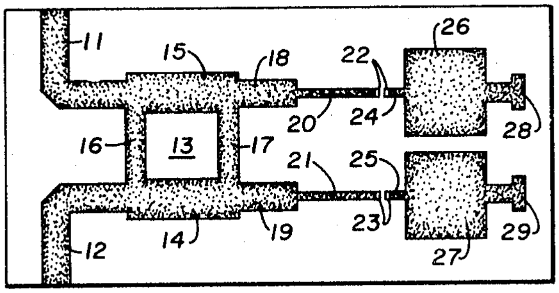
FIGURE 2 is a top view of a semiconductor wafer on which an integrated circuit corresponding to the mixer of FIGURE 1 is formed.

More particularly, as shown in FIGURE 2, a semiconductor wafer 10 is provided with a signal input strip 11 and a local oscillator input strip 12. Strips 11 and 12 are metalized regions overlaying a high-resistivity semiconductor wafer. The metalized regions 11 and 12 lead to the input portions of a hybrid coupler 13. The coupler 13 is provided with parallel sections 14 and 15 which are about one-quarter wavelength long and are of a width substantially greater than the width of the strips 11 and 12. Two shunt strips 16 and 17 are spaced approximately one-quarter wavelength apart and extend between sections 14 and 15. Output lines 18 and 19 extend from the coupler 13.

A pair of quarter-wave transformer sections 20 and 21 extend from the output strips 18 and 19, respectively, and make contact with terminals of surface-oriented diodes 22 and 23, respectively. Output conductors 24 and 25 lead from the other terminals of diodes 22 and 23 to output capacitors 26 and 27 to provide an output signal at output terminals 28 and 29.

With strip-line transmission lines overlaying the semiconductor wafer 10 and with surface-oriented diodes of a construction hereinafter described, a signal in the X-band may be converted to IF with about a 5 db loss. For example, a 9 gc. signal may be applied to strip 11. A local oscillator signal at 8.5 gc. may be applied to the input strip 12. As a result, an IF signal of 500 mc. is produced at terminals 28 and 29.

Figures 3, 4:
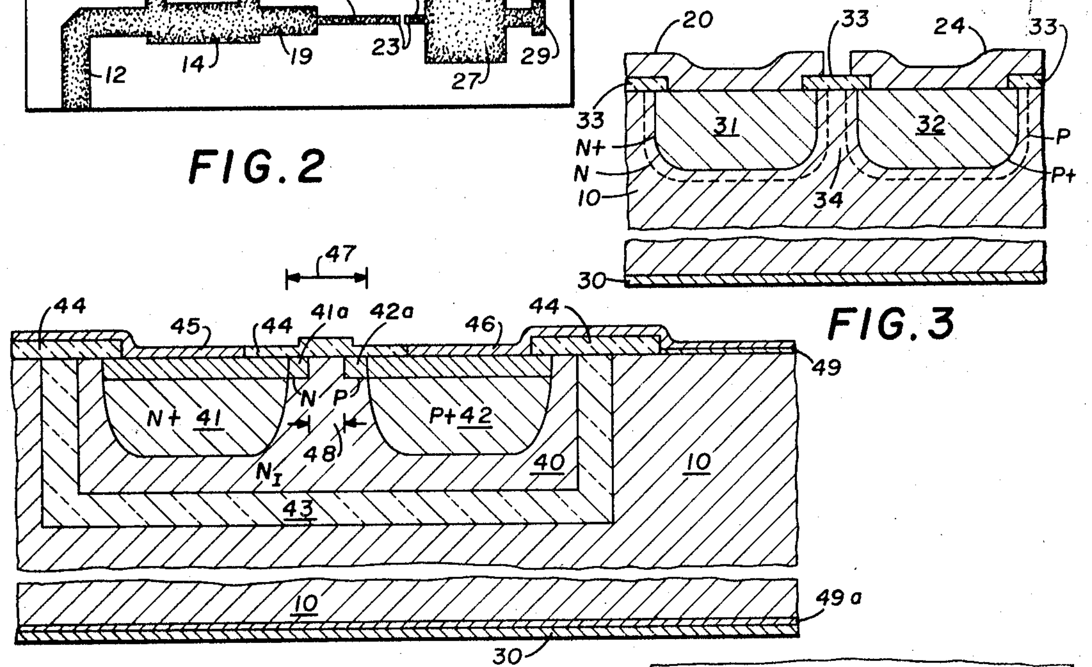
FIGURE 3 is a sectional view of one embodiment of a surface-oriented diode of FIGURE 2.
FIGURE 4 is a sectional view of a further embodiment of the diode.

The surface-oriented diode 22 is illustrated in one form in FIGURE 3. The wafer 10, of intrinsic silicon, is provided with a ground plane conductive layer 30. The intrinsic silicon forms a high-resistivity zone above the ground plane layer 30. An N-type alloyed region 31 and a P-type alloyed region 32 are formed in the surface of the wafer 10 opposite the ground plane layer 30. A silicon dioxide insulating layer 33 is formed over the upper surface of wafer 10 to cover the surface emergence of the junctions forming the boundaries between the P-type and N-type alloyed sections and the intrinsic wafer 10. An N-type metal alloy strip 20 is then formed on the surface of the wafer 10 so as to make electrical contact with the N-type region 31. A P-type metal alloy strip 24 is formed on the surface to make electrical contact with the region 32. The P-type and N-type metal alloy strips 20 and 24 are evaporated onto the surface through holes in oxide masks defined by photolithographic techniques. The metal alloy strips are then alloyed into the silicon to produce the N+ and P+ regions between the strips and the N-type and P-type regions 31 and 32. An intrinsic region 34 is disposed between the N and P regions, the boundary junctions of which are shown in dotted outline.

Such fabrication of the surface-oriented mixer diode is in a form compatible with the integrated circuit construction. The diode is a substantial improvement over conventional microwave mixer elements. Previous mixer diodes have been of the point contact variety in order to maintain low junction capacitance. The present construction has achieved junction capacitances of 0.05 picofarad (pf.) or less. When biased by rectification of the local oscillator signal to obtain the best noise figure, the shunt resistance of the junction of the present invention is approximately 400 ohms. In ordinary mixer diode configuration, this value of resistance is transformed to an input impedance of about 50 to 100 ohms by the package inductance and the junction capacitance. In the present case, the junction diameter of the diode is approximately 0.1 mil (0.0001 inch). Production of a semiconductor junction of this size, as above noted, employs intrinsic silicon having side-by-side alloy zones to form confronting edge junctions that will give the surface diode effect.

The material required for the integrated circuit preferably will provide a suitable substrate for microwave strip transmission lines and for forming the mixer semiconductor junctions. Intrinsic silicon and high-resistivity gallium arsenide may be employed for mixer diodes, whereas germanium has characteristics which are not suitable for both the microwave strip transmission line and the diode construction. Where extremely low loss transmission lines are required, low loss dielectrics with deposited silver conductors are employed. Yttrium-iron-garnet (YIG) substrates may also be employed for this purpose.

FIGURE 4 illustrates a modified form of surface-oriented diode wherein side-by-side diffusions of opposite-conductivity type impurities are formed on the upper surface of an intrinsic silicon wafer 40. The N-type diffused zone 41$a$ and the P-type diffused zone 42$a$ are characterized by an edge junction that will give the surface diode effect. The zones 41$a$ and 42$a$ are formed partially in N+ and P+ diffusion zones 41 and 42, respectively, which in turn are formed in an insulated island of intrinsic silicon about 1 mil wide and 5 mils long formed in the wafer by an insulating layer 43 of silicon dioxide.

The spacing between the edges of the diffused N+ and P+ zones 41 and 42 is about 0.3 mil in zone 47. However, the zone 48 between the confronting junctions of the N and P zones 41$a$ and 42$a$ is about 0.1 mil wide. The capacitance of the junction is defined by the effective junction area of the shallow diffusions and the reverse breakdown by the shallow diffused spacing and the intrinsic or I-layer concentration. Conductivity modulation under forward current conditions is minimized by reason of the effective increase injection area of the anode of the deep P+ diffusion. The problem is in defining the I-layer between the diffusion fronts so that a sufficient current density can be obtained at reasonable current levels. For currents of 20 milliamps, about a 4 square mil area will give a current density of 200 amps per square centimeter required for conductivity modulation. An insulating layer 44 covers the surface of the wafer except for metalized contact zones 45 and 46.

Surface-oriented diodes of the type illustrated in FIGURES 3 and 4 may be employed in the mixer of FIGURE 2. Where additional current-carrying capacity is required of surface-oriented diodes, as in the transmit-receive switches employed in various systems, the construction such as shown in FIGURE 5 may be employed.

Figure 5:
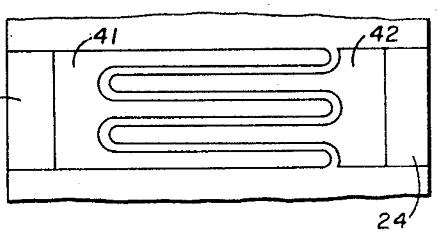
FIGURE 5 illustrates an interdigitated surface-oriented diode.

In FIGURE 5, the transmission lines 20 and 24 are shown contacting the diffused zones 41 and 42, respectively. The diffused zone 41 has three fingers. The zone 42 has two fingers with the fingers being enmeshed or interdigitated to provide a junction of high current-carrying capability. Such a construction exhibits low junction capacitance under moderate reversed-bias conditions and low loss.

Intrinsic silicon as the substrate material for the diodes provides insulation isolation for any number of components deposited upon it and also provides a low loss structure. The structure is readily adaptable to receiving strip transmission lines deposited directly onto the silicon. In accordance with one mode of fabrication, a ground plane conductor is evaporated onto the bottom of an intrinsic silicon substrate of approximately 5 mils thickness. Silicon dioxide on the top is etched to expose the silicon where transmission lines are required. Gold is then evaporated over the entire surface and selectively removed to leave gold over the exposed regions of the silicon. Preferably, in order to maintain the propagation properties of the lines, the alloying of gold with silicon will be avoided, as by the forming of a thin layer, a few microns thick, of a material such as molybdenum between the gold strips and the silicon.

As an alternative mode of fabrication, a hot substrate evaporation of gold onto the intrinsic silicon is carried out. The gold is then etched away to leave the transmission lines where required. At microwave frequencies, the degradation of leakage current due to the introduction of the gold into the silicon is of little consequence. In the same manner, aluminum strip transmission lines may be formed on gallium arsenide to form the transmission line pattern on a given substrate. Thus, the mixer of FIGURE 2 is a flat, integrated circuit package. The integrated circuit may be part of more complex circuits formed on the same or interconnected substrates.

Figure 6:
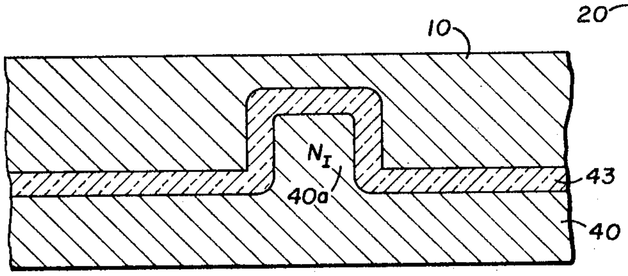
FIGURE 6 illustrates preliminary steps in forming the diode of FIGURE 4.
Figure 7:
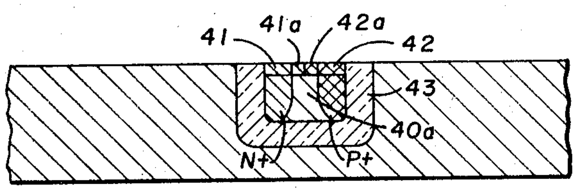
FIGURE 7 illustrates further processing steps in forming the diode of FIGURE 4.
Figure 8:
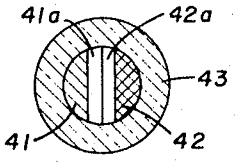
FIGURE 8 is a top view of the diode of FIGURE 7.

Referring again to FIGURE 4, a diffused, surface-oriented diode with insulation isolation represents a preferred embodiment of the invention. One procedure for forming this structure is shown in FIGURES 6–8. The structure illustrated in FIGURES 6–8 is similar to the structure illustrated in FIGURE 4, and corresponding parts will therefore be designated by corresponding reference numerals. However, the structure of FIGURES 6–8 is illustrated as round while the structure of FIGURE 4 is rectangular. The surface of a single crystal, high-resistivity substrate of N-type material is etched on the surface to form a mesa 40$a$ on the top surface. The oxide layer 43 is then grown over the upper surface of the etched wafer and over the mesa 40$a$ to form an insulating layer over the entire etched surface. The material forming the bulk substrate 10 of the structure in FIGURE 4 is then deposited or grown over the top of the slice 40 to completely cover the insulation layer 43 and to surround the insulation covered mesa. After the bulk material 10 is grown onto the top of the wafer, the top (in FIGURE 6) of the bulk material 10 is lapped smooth for receiving the ground plane conducting layer 30 shown in FIGURE 4.

The substrate 40 is then lapped so that all of the original wafer is removed except for the mesa which is then the island **40*a* located in a well or depression surrounded by the isolation layer of silicon oxide 43 as shown in FIGURE 7. Thereafter as shown in FIGURE 8, through a photomasking technique, N+ and P+ diffusions are made to form the zones 41 and 42 of opposite-conductivity types in the island 40*a*. Inside the island there is then high enough impurity concentration for good low resistivity ohmic contact. The low resistivity (high concentration) diffusions have a very narrow intrinsic zone between them, of the order of 0.3 mil wide. Into this area of original material, there are made two very shallow diffusions 41*a* and 42*a* of N and P-type materials, respectively. The diffusions are very shallow (3 lines or $3\times0.016$ mil) with high concentrations. The junction between the N and P shallow diffusion zones 41*a* and 42*a* is not or need not be accurately positioned as long as it is within the 0.3 mil strip. The junction between the two zones is 1 mil wide and 3 lines deep or an area of $1\times3\times0.016$ mils=0.048 sq. mil. This results in a very low capacitance junction suitable for use in the mixer of FIGURE 1. Contacts 45 and 46** are readily applied to the two N+ and P+ regions of FIGURES 7 and 8 to be used for bonding or pressure contacts alloyed in.

Where the diode is to be employed in the mixer application, the separation 48, FIGURE 4, between the junctions will be reduced to zero. The boundaries of the two zones will thus be contiguous. Surface-oriented diodes for use in switching applications will be constructed with separation between the two zones and for high current capability, will be interdigitated as shown in FIGURE 5.

In FIGURE 4 the transmission lines 45 and 46 extend along the top of the insulating layer 44 from contact with the zones 41 and 42. Preferably, the transmission line leading to and from the surface-oriented diode, except for the insulation over the junctions as shown in FIGURE 4, will be formed directly on the surface of the semiconductor material 10. Preferably, ground plane conductor 30 and the low resistance conductive strips 45 and 46 are gold and overlay an extremely thin film of a metal such as molybdenum, as above noted, or of vanadium, platinum, nickel or tungsten evaporated to a thickness of a few microns to form an underlayer for each strip. The underlayer having a high eutectic temperature will prevent the formation of lossy zones that would otherwise be present were gold strips to be formed directly onto the silicon surface and then subjected to treatment at temperatures wherein the silicon would become intermixed with the gold at the boundary thereof. Such zones are avoided by the use of the thin film 49. The ground plane layer 30 is shown as having been formed over a film **59*a* on the bottom surface of the structure as shown in FIGURE 4 where the film 49*a* would be of materials the same as film 49**.

The mixer unit shown in FIGURE 1 is described and claimed in copending application Ser. No. 397,480, titled "Microwave Integrated Circuit Mixer," filed Sept. 18, 1967 and assigned to the assignee of the present application.

This copending application is particularly directed to a microwave mixer device utilizing a device in accordance with the present invention. The underlayer of high eutectic temperature metal preferably extends under the gold wherever it is deposited over either the silicon wafer or the silicon dioxide in solution.

Thus in accordance with this invention, the combination structure described provides a low loss high frequency strip transmission line in an integrated circuit. The gold strip of the desired shape and position provides a minimum series loss and an easy material to work with. The underlayer of molybdenum or other high eutectic temperature metal insures a smooth boundary for the conductive strip to further reduce losses. The relatively high dielectric constant of the intrinsic silicon or high-resistivity gallium arsenide further reduces the loss and the ground plane of gold over the high eutectic underlayer provides the complete structure.

Having described the invention in connection with certain specific embodiments thereof, it is to be understood that further modifications may now suggest themselves to those skilled in the art and it is intended to cover such modifications as fall within the scope of the appended claims.

I claim:

In the claims:

1. A high frequency transmission line adapted for use in a microwave integrated circuit device, said transmission line comprising:

a high resistivity semiconductor wafer having first and second opposed surfaces, a first substantially continuous layer of gold disposed over preselected portions of said first surface of said wafer, a second substantially continuous gold layer disposed over said second surface of said wafer, first and second films of metallic material respectively disposed intermediate said first and second layers of gold and said first and second surfaces of said wafer, said first and second films having a eutectic temperature when combined with said semiconductor wafer substantially in excess of the eutectic temperature of said gold layer when combined with said semiconductor wafer so as to provide a smooth boundary between said gold layers and the opposed surfaces of said semiconductor wafer.

2. A high frequency transmission line according to claim 1 wherein said first and second films comprise relatively thin films of molybdenum.

3. A high frequency transmission line according to claim 2 wherein said wafer is of intrinsic silicon.

4. A high frequency transmission line according to claim 1 wherein said first and second films comprise relatively thin films of vanadium.

5. A high frequency transmission line according to claim 1 wherein said first and second films comprise relatively thin films of platinum.

6. A high frequency transmission line according to claim 1 wherein said first and second films comprise relatively thin films of nickel.

7. A high frequency transmission line according to claim 1 wherein said first and second films comprise relatively thin films of tungsten.

8. A microwave integrated circuit device comprising:

a substrate of high resistivity semiconductor material having first and second opposed surfaces, a plurality of circuit components formed by alternate conductivity type regions of semiconductor material at said first surface of said substrate, at least one thin gold strip at said first surface making ohmic contact with an interconnecting selected ones of said circuit components solely at said first face, a substantially continuous thin gold layer providing a ground plane at said second surface of said substrate separated from said circuit components by the high resistivity substrate material, and a first and second films of metallic material respectively disposed intermediate said gold strip and said first surface and intermediate said gold layer and said second surface, said first and second films having a eutectic temperature when combined with said semiconductor material substantially in excess of the eutectic temperature between said semiconductor material and said thin gold layer or said gold strip as to provide a smooth boundary between said semiconductor material and said gold layer and said gold strip.

9. A microwave integrated circuit according to claim 8 wherein said semiconductor material comprises silicon and said first and second metallic films comprise molybdenum.

References Cited

UNITED STATES PATENTS

| | | | |
|---|---|---|---|
| 2,981,877 | 4/1961 | Noyce | 317—235 |
| 3,008,089 | 11/1961 | Uhlir | 330—5 |
| 3,249,764 | 5/1966 | Holonyak | 307—88.5 |
| 3,022,472 | 2/1962 | Tannenbaum | 333—18 |
| 3,280,391 | 10/1966 | Bittman et al. | 317—234 |

OTHER REFERENCES

Proc. Inst. Elec. Engineers, December, 1964 pp. 1617–23, A. Uhlir, Microwave Integrated Circuits.

HERMAN KARL SAALBACH, *Primary Examiner.*

C. BARAFF, *Assistant Examiner.*

U.S. Cl. X.R.

117—217; 307—303; 317—101, 234